(12) United States Patent
Yoder

(10) Patent No.: US 11,736,122 B1
(45) Date of Patent: Aug. 22, 2023

(54) MAXIMUM-LIKELIHOOD DECODING OF QUANTUM CODES

(71) Applicant: International Business Machines Corporation, Armonk, NY (US)

(72) Inventor: Theodore James Yoder, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/654,545

(22) Filed: Mar. 11, 2022

(51) Int. Cl.
H03M 13/11 (2006.01)
H03M 13/01 (2006.01)
H03M 13/09 (2006.01)

(52) U.S. Cl.
CPC ....... H03M 13/1125 (2013.01); H03M 13/01 (2013.01); H03M 13/09 (2013.01)

(58) Field of Classification Search
CPC ... H03M 13/1125; H03M 13/01; H03M 13/09
See application file for complete search history.

(56) References Cited

U.S. PATENT DOCUMENTS

| | | | | |
|---|---|---|---|---|
| 2020/0119748 | A1* | 4/2020 | Lucarelli | H03M 13/11 |
| 2021/0124640 | A1* | 4/2021 | Nickerson | G06N 10/00 |
| 2022/0101172 | A1* | 3/2022 | Lee | G06N 10/70 |
| 2022/0198312 | A1* | 6/2022 | Delfosse | G06F 11/1048 |

OTHER PUBLICATIONS

J.-P. Tillich and G. Zemor, "Quantum LDPC codes with positive rate and minimum distance proportional to n1/2", in Information Theory, 2009. ISIT 2009. IEEE International Symposium on, 28, 2009-Jul. 3, 2009, pp. 799-803.*

A. A. Kovalev and L. P. Pryadko, "Improved quantum hypergraph-product LDPC codes," 2012 IEEE International Symposium on Information Theory Proceedings, Cambridge, MA, USA, 2012, pp. 348-352.*

Shashanka Balakuntala and Goutam Paul, "Quantum Error Correction using Hypergraph States", PSG College of Technology, Department of Applied Mathematics and Computational Sciences, Coimbatore 641 004, India, Aug. 12, 2017.*

(Continued)

*Primary Examiner* — Steve N Nguyen

(74) *Attorney, Agent, or Firm* — Amin, Turocy & Watson, LLP

(57) ABSTRACT

Techniques regarding quantum error correction are provided. For example, one or more embodiments described herein can comprise a system, which can comprise a memory that can store computer executable components. The system can also comprise a processor, operably coupled to the memory, and that can execute the computer executable components stored in the memory. The computer executable components can comprise a maximum-likelihood decoder component that executes a maximum-likelihood decoding algorithm to determine an error correction based on a decoding hypergraph that characterizes error-sensitive events associated with a quantum error-correcting code executed on a quantum circuit.

20 Claims, 11 Drawing Sheets

(56) References Cited

OTHER PUBLICATIONS

Leonid P. Pryadko, "On maximum-likelihood decoding with circuit-level errors", Department of Physics & Astronomy, University of California, Riverside, California 92521, USA, Jul. 15, 2020.*
H. J. Garcia and I. L. Markov, "Quipu: High-performance simulation of quantum circuits using stabilizer frames," 2013 IEEE 31st International Conference on Computer Design (ICCD), Asheville, NC, USA, 2013, pp. 404-410.*
Poulin D., "Stabilizer Formalism for Operator Quantum Error Correction", Physical Review Letters, vol. 95, 2005, 5 pages.
Dennis et al., "Topological Quantum Memory", Journal of Mathematical Physics, vol. 43, No. 9, Sep. 2002, pp. 4452-4505.
Bombin et al., "Topological Quantum Distillation", Physical Review Letters, vol. 97, 180501, 2006, 4 pages.
Piveteau et al., "Error Mitigation for Universal Gates on Encoded Qubits", Physical Review Letters, vol. 127, Nov. 12, 2021, 11 pages.
Chamberland et al., "Fault-tolerant Quantum Computing in the Pauli or Clifford Frame With Slow Error Diagnostics", Quantum, vol. 2, 2018, 11 pages.
DiVincenzo et al., "Effective Fault-tolerant Quantum Computation With Slow Measurements", Physical Review Letters, vol. 98, 2007, 4 pages.
Linke et al., "Fault-tolerant Quantum Error Detection", Science Advances, vol. 3, No. 10, e1701074, Oct. 20, 2017, pp. 1-6.
Abobeih et al., "Fault-tolerant Operation of a Logical Qubit in a Diamond Quantum Processor", arXiv:2108.01646 [condmat, physics:quant-ph], Aug. 3, 2021, 26 pages.
Takita et al., "Experimental Demonstration of Fault-tolerant State Preparation with Superconducting Qubits", Physical Review Letters, vol. 119, Oct. 31, 2017, 11 pages.
Andersen et al., "Repeated Quantum Error Detection in a Surface Code", Nature Physics, vol. 16, No. 8, 2020, 12 pages.
Chen et al., "Exponential Suppression of Bit or Phase Errors With Cyclic Error Correction", Nature, vol. 595, Jul. 15, 2021, pp. 383-387.
Chen et al., "Calibrated Decoders for Experimental Quantum Error Correction", arXiv preprint, arXiv:2110.04285v1 [quant-ph], Oct. 8, 2021, 17 pages.
Marques et al., "Logical-Qubit Operations in an Error-detecting Surface Code", arXiv:2102.13071v1 [cond-mat, physics:quant-ph], Feb. 25, 2021, 16 pages.
Postler et al., "Demonstration of Fault-tolerant Universal Quantum Gate Operations", arXiv:2111.12654v2 [quant-ph], Dec. 17, 2021, 14 pages.
Krinner et al., "Realizing Repeated Quantum Error Correction in a Distance-three Surface Code", arXiv:2112.03708v1 [quant-ph], Dec. 7, 2021, 28 pages.
Zhao et al., "Realizing an Error-correcting Surface Code With Superconducting Qubits," arXiv:2112.13505v2 [quant-ph], 2021, 10 pages.
Anderson et al., "Realization of Realtime Fault-tolerant Quantum Error Correction", arXiv:2107.07505v1 [quant-ph], Jul. 15, 2021, 22 pages.
Egan et al., "Fault-tolerant Control of an Error-Corrected Qubit", Nature, vol. 598, Oct. 14, 2021, pp. 281-286.
Bacon D., "Operator Quantum Error-correcting Subsystems for Self-correcting Quantum Memories", Physical Review A, vol. 73, Jan. 30, 2006, 13 pages.
Chamberland et al., "Topological and Subsystem Codes on Low-degree Graphs With Flag Qubits", Physical Review X, vol. 10, Jan. 31, 2020, 19 pages.
Fowler et al., "Towards Practical Classical Processing for the Surface Code", Physical Review Letters, vol. 108, May 1, 2012, 4 pages.
Higgott O., "PyMatching: a Python Package for Decoding Quantum Codes With Minimum-weight Perfect Matching", arXiv:2105.13082v2 [quant-ph], Jul. 12, 2021, 15 pages.
Dua et al., "Quantum Error Correction With Fractal Topological Codes", arXiv:2201.03568v1, Jan. 10, 2022, 16 pages.
"IBM Peekskill v2.0.0", an IBM Quantum Falcon R8 processor, https://quantum-computing.ibm.com/, accessed Jan. 2022.
"IBM Quantum and Community", Qiskit: an open-source framework for quantum computing, 2021.
Sundaresan et al., "Reducing Unitary and Spectator Errors in Cross Resonance with Optimized Rotary Echoes", PRX Quantum, vol. 1, Dec. 7, 2020, 23 pages.
Byrd et al., "A Limited Memory Algorithm for Bound Constrained Optimization", SIAM Journal on Scientific Computing, vol. 16, No. 5, Sep. 1995, pp. 1190-1208.
Hertzberg et al., "Laser-annealing Josephson Junctions for Yielding Scaled-up Superconducting Quantum Processors", npj Quantum Information, vol. 7, 2021, 8 pages.
Wood et al., "Quantification and Characterization of Leakage Errors", Physical Review A, vol. 97, Mar. 8, 2018, 17 pages.
Sank et al., "Measurement Induced State Transitions in a Superconducting Qubit: Beyond the Rotating Wave Approximation", Physical Review Letters, vol. 117, Nov. 4, 2016, 6 pages.
Bravyi et al., "Mitigating Measurement Errors in Multiqubit Experiments", Physical Review A, vol. 103, Apr. 9, 2021, 12 pages.
Bravyi, et al., "Efficient Algorithms for Maximum Likelihood Decoding in the Surface Code," techarXiv:1405.4883v1 [quant-ph] May 19, 2014, 18 pages.
Bravyi, et al., "Doubled Color Codes," arXiv:1509.03239v1 [quant-ph] Sep. 10, 2015, 53 pages.
Heim, et al., "Optimal Circuit-Level Decoding for Surface Codes," arXiv:1609.06373v1 [quant-ph] Sep. 20, 2016, 5 pages.
Pryadko, "On maximum-likelihood decoding with circuit-level errors," arXiv:1909.06732v4 [quant-ph] Jul. 31, 2020, 15 pages.
Higgott, et al., "Subsystem Codes with High Thresholds by Gauge Fixing and Reduced Qubit Overhead," Phys. Rev. X 11, 031039—Published Aug. 19, 2021.
Mell et al., The NIST Definition of Cloud Computing, Recommendations of the National Institute of Standards and Technology, NIST Special Publication 800-145, Sep. 2011, 7 pages.
Gottesman, "The Heisenberg Representation of Quantum Computers," arXiv:quant-ph/9807006v1 Jul. 1, 1998, 20 pages.

* cited by examiner

700 ⟶

| Job (500k shots) | Uniform | RB | Maximum-likelihood Decoder Component 114 |
|---|---|---|---|
| 875 | 21.72(6)% | 17.46(7)% | 14.68(4)% |
| 876 | 21.59(6)% | 17.50(7)% | 14.69(5)% |
| 877 | 20.81(6)% | 17.00(4)% | 14.42(4)% |
| 878 | 21.23(5)% | 17.42(4)% | 14.58(4)% |
| 879 | 22.04(4)% | 17.95(6)% | 15.08(6)% |
| 880 | 21.60(6)% | 17.13(5)% | 14.03(3)% |
| 881 | 20.79(3)% | 16.75(4)% | 14.23(4)% |
| 882 | 20.75(4)% | 16.54(4)% | 13.49(4)% |
| 884 | 20.84(5)% | 17.11(6)% | 14.40(3)% |
| 885 | 20.48(5)% | 16.38(6)% | 13.75(4)% |
| All together | 21.19(2)% | 17.13(2)% | 14.34(2)% |

FIG. 7

MAXIMUM-LIKELIHOOD DECODING OF QUANTUM CODES

This invention was made with Government support under Contract No.: W911NF-16-1-0114 awarded by Intelligence Advanced Research Projects Activity (IARPA). The Government has certain rights in this invention.

BACKGROUND

The subject disclosure relates to executing a maximum-likelihood algorithm in decoding a quantum error correction (QEC) code, and more specifically, to maximum likelihood decoding of QEC codes on quantum circuits based on one or more decoding hypergraphs.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that can employ a maximum-likelihood algorithm for decoding QEC codes are described.

According to an embodiment, a system is provided. The system can comprise a memory that stores computer executable components. The system can also comprise a processor, operably coupled to the memory, and that executes the computer executable components stored in the memory. The computer executable components can comprise a maximum-likelihood decoder component that can execute a maximum-likelihood decoding algorithm to determine an error correction based on a decoding hypergraph that characterizes error-sensitive events associated with a quantum error-correcting code executed on a quantum circuit.

According to an embodiment, a computer-implemented method is provided. The computer-implemented method can comprise executing, by a system operatively coupled to a processor, a maximum-likelihood decoding algorithm to determine an error correction based on a decoding hypergraph that characterizes error-sensitive events associated with a quantum error-correcting code executed on a quantum circuit.

According to an embodiment, a computer program product for quantum error correction is provided. The computer program product can comprise a computer readable storage medium having program instructions embodied therewith. The program instructions can be executable by a processor to cause the processor to execute a maximum-likelihood decoding algorithm to determine an error correction based on a decoding hypergraph that characterizes error-sensitive events associated with a quantum error-correcting code executed on a quantum circuit.

BRIEF DESCRIPTION OF THE DRAWINGS

FIG. 7 illustrates a diagram of an example, non-limiting table that can demonstrate the efficacy of a maximum-likelihood decoder component at determining error correction for a quantum circuit in accordance with one or more embodiments described herein.

DETAILED DESCRIPTION

Figure 1:
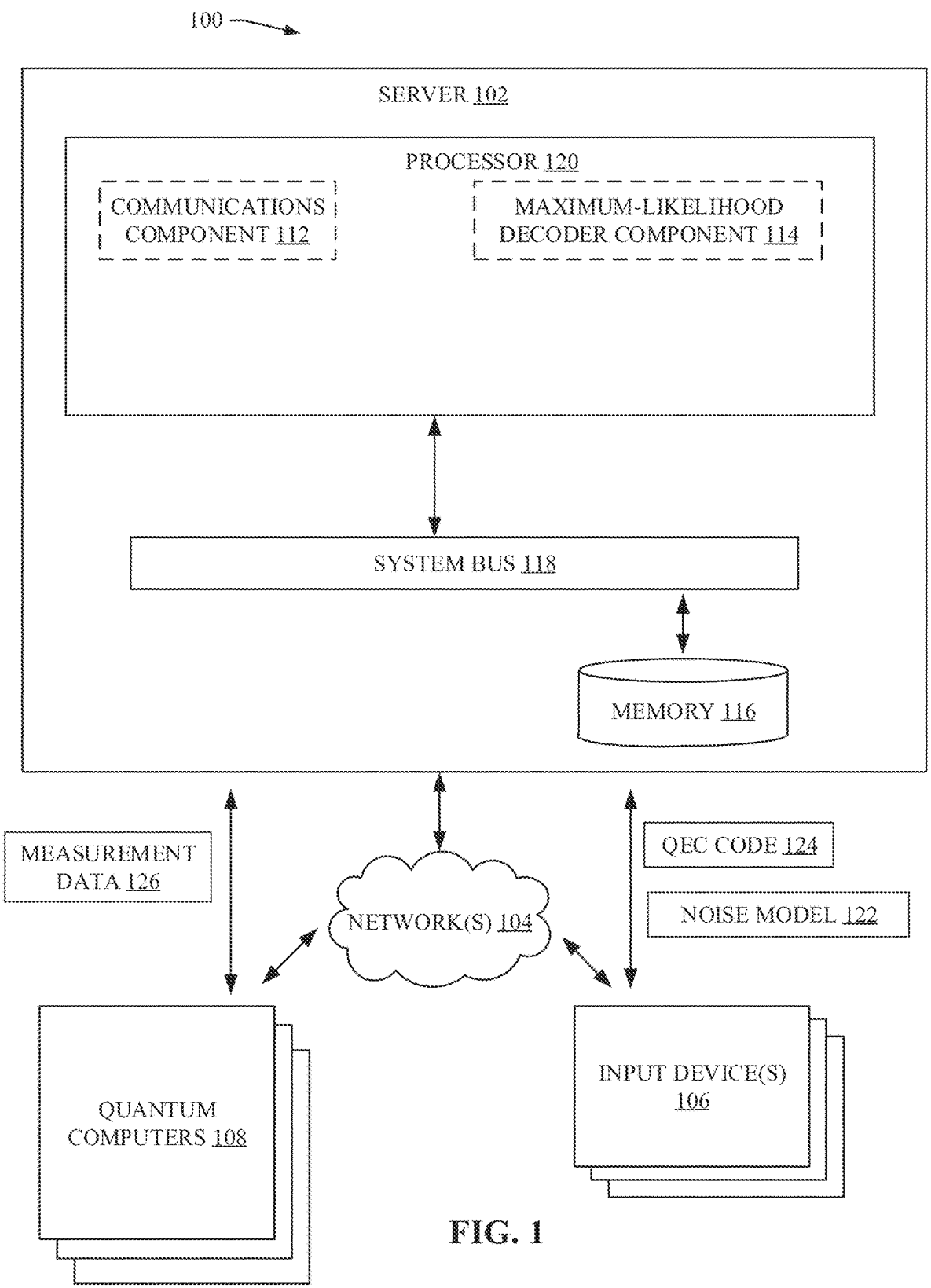
FIG. 1 illustrates a block diagram of an example, non-limiting system that can execute a maximum-likelihood decoding algorithm in determining one or more quantum error corrections for a quantum circuit in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The results of quantum computations can be faulty due to noise in the quantum circuit hardware. For example, noise can corrupt underlying qubits while preparing and/or preserving logical quantum states. To eliminate the resulting faults, QEC codes can be used to encode the quantum information into protected, logical degrees of freedom, such that the faults can be corrected faster than they accumulate. Execution of QEC codes can comprise repeat measurements of a syndrome circuit and the decoding of the syndromes for correcting errors.

Decoding algorithms can utilize a decoding graph to track and/or map error-sensitive events associated with the syndrome circuit defined by a QEC code. The efficiency of the decoding algorithms can be dependent on the edge weights assigned to the decoding graph, where the edge weights can characterize the probability of a represented Pauli error. Further, decoding algorithms are traditionally applied to noise models that characterize errors occurring only prior to the measurement of quantum circuit stabilizers, which inherently neglects errors that can propagate through the stabilizer measurement circuitry. Given the problems with other implementations of QEC decoding; the present disclosure can be implemented to produce a solution to one or more of these problems by employing a maximum-likelihood decoding algorithm based on probability distributions associated with error-sensitive events. One or more embodiments described herein can employ dynamic circuits and/or concurrent classical computations as part of a syndrome extraction protocol; thereby enabling the use of real-time feedback to reduce the impact of energy relaxation error in the syndrome and flag qubits.

Various embodiments of the present invention can be directed to computer processing systems, computer-implemented methods, apparatus and/or computer program products that facilitate the efficient, effective, and autonomous (e.g., without direct human guidance) execution of a maximum-likelihood decoder for one or more QEC codes associated with a fault-tolerant quantum circuit. For example, one or more embodiments described herein can generate a decoding hypergraph that provides a succinct description of the information collected by a fault-tolerant quantum circuit and the effects of errors (e.g., errors resulting from Pauli faults). Based on the decoding hypergraph, various embodiments described herein can generate a probability distribution representing probabilities and/or corrections associated with error-sensitive events. Further, a maximum-likelihood decoding algorithm can be employed using the probability distribution to determine an optimal correction for a measured error-sensitive event.

The computer processing systems, computer-implemented methods, apparatus and/or computer program products employ hardware and/or software to solve problems that are highly technical in nature (e.g., quantum error correction), that are not abstract and cannot be performed as a set of mental acts by a human. For example, an individual, or a plurality of individuals, cannot initialize syndrome and/or flag qubits of a quantum circuit between measurement cycles to mitigate errors in quantum computations.

Also, one or more embodiments described herein can constitute a technical improvement over conventional quantum error correction by incorporating mid-circuit measurements and/or conditional operations as part of a QEC protocol. For example, various embodiments described herein can implement a maximum-likelihood decoding algorithm with regards to a variety of fault-tolerant quantum circuits, including quantum circuits with flag qubit measurements. Further, one or more embodiments described herein can have a practical application by enabling quantum error correction on qubits (e.g., superconducting qubits) connected via a fault-tolerant topology, such as a heavy-hexagon topology. For instance, various embodiments described herein can enable the correction of a physical error after each round of syndrome measurements on the quantum circuit.

FIG. 1 illustrates a block diagram of an example, non-limiting system 100 that can optimally correct for errors in quantum computations given a QEC code, fault-tolerant quantum circuit, and/or noise model. Repetitive description of like elements employed in other embodiments described herein is omitted for the sake of brevity. Aspects of systems (e.g., system 100 and the like), apparatuses or processes in various embodiments of the present invention can constitute one or more machine-executable components embodied within one or more machines, e.g., embodied in one or more computer readable mediums (or media) associated with one or more machines. Such components, when executed by the one or more machines (e.g., computers, computing devices, virtual machines, a combination thereof, and/or the like) can cause the machines to perform the operations described.

As shown in FIG. 1, the system 100 can comprise one or more servers 102, one or more networks 104, input devices 106, and/or quantum computers 108. The server 102 can comprise communications component 112 and/or maximum-likelihood decoder component 114. Also, the server 102 can comprise or otherwise be associated with at least one memory 116. The server 102 can further comprise a system bus 118 that can couple to various components such as, but not limited to, the maximum-likelihood decoder component 114 and associated components, memory 116 and/or a processor 120. While a server 102 is illustrated in FIG. 1, in other embodiments, multiple devices of various types can be associated with or comprise the features shown in FIG. 1. Further, the server 102 can communicate with one or more cloud computing environments, and in such embodiments the one or more cloud computing environments can perform some or all of the calculations related to communications component 112 and/or maximum-likelihood decoder component 114. Additionally, while FIG. 1 depicts server 102 connected to quantum computer 108 through the networks 104, at least one of the one or more servers 102 may be directly connected to quantum computer 108.

The one or more networks 104 can comprise wired and wireless networks, including, but not limited to, a cellular network, a wide area network (WAN) (e.g., the Internet) or a local area network (LAN). For example, the server 102 can communicate with the one or more input devices 106 and/or quantum computers 108 (and vice versa) using virtually any desired wired or wireless technology including for example, but not limited to: cellular, WAN, wireless fidelity (Wi-Fi), Wi-Max, WLAN, Bluetooth technology, a combination thereof, and/or the like. Further, although in the embodiment shown the maximum-likelihood decoder component 114 can be provided on the one or more servers 102, it should be appreciated that the architecture of system 100 is not so limited. For example, the maximum-likelihood decoder component 114, or one or more components of maximum-likelihood decoder component 114, can be located at another computer device, such as another server device, a client device, and/or the like.

The one or more input devices 106 can comprise one or more computerized devices, which can include, but are not limited to: personal computers, desktop computers, laptop computers, cellular telephones (e.g., smart phones), computerized tablets (e.g., comprising a processor), smart watches, keyboards, touch screens, mice, a combination thereof, and/or the like. The one or more input devices 106 can be employed to enter into the system: one or more noise models 122, QEC codes 124. Thereby the one or more input devices 106 can share (e.g., via a direct connection and/or via the one or more networks 104) said data with the server 102. For example, the one or more input devices 106 can send data to the communications component 112 (e.g., via a direct connection and/or via the one or more networks 104). Additionally, the one or more input devices 106 can comprise one or more displays that can present one or more outputs generated by the system 100 to a user. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

In various embodiments, the one or more input devices 106 and/or the one or more networks 104 can be employed to input one or more settings and/or commands into the system 100. For example, in the various embodiments described herein, the one or more input devices 106 can be employed to operate and/or manipulate the server 102 and/or associate components. Additionally, the one or more input devices 106 can be employed to display one or more outputs (e.g., displays, data, visualizations, and/or the like) generated by the server 102 and/or associate components. Further, in one or more embodiments, the one or more input devices 106 can be comprised within, and/or operably coupled to, a cloud computing environment.

In various embodiments, the one or more quantum computers 108 can comprise quantum hardware devices that can utilize the laws of quantum mechanics (e.g., such as superposition and/or quantum entanglement) to facilitate computational processing (e.g., while satisfying the DiVincenzo criteria). In one or more embodiments, the one or more quantum computers 108 can comprise a quantum data plane, a control processor plane, a control and measurement plane, and/or a qubit technology.

In one or more embodiments, the quantum data plane can include one or more quantum circuits comprising physical qubits, structures to secure the positioning of the qubits, and/or support circuitry. The support circuitry can, for example, facilitate measurement of the qubits' state and/or perform gate operations on the qubits (e.g., for a gate-based system). In some embodiments, the support circuitry can comprise a wiring network that can enable multiple qubits to interact with each other. Further, the wiring network can facilitate the transmission of control signals via a direct electrical connection and/or electromagnetic radiation (e.g., optical, microwave, and/or low-frequency signals). For instance, the support circuitry can comprise one or more superconducting resonators operatively coupled to the one or more qubits. As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

In one or more embodiments, the control processor plane can identify and/or trigger a Hamiltonian sequence of quantum gate operations and/or measurements, wherein the sequence executes a program (e.g., provided by a host processor, such as server 102) for implementing a quantum algorithm. For example, the control processor plane can convert compiled code to commands for the control and measurement plane. In one or more embodiments, the control processor plane can further execute one or more quantum error correction algorithms.

In one or more embodiments, the control and measurement plane can convert digital signals generated by the control processor plane, which can delineate quantum operations to be performed, into analog control signals to perform the operations on the one or more qubits in the quantum data plane. Also, the control and measurement plane can convert one or more analog measurement outputs of the qubits in the data plane to classical binary data that can be shared with other components of the system 100.

One of ordinary skill in the art will recognize that a variety of qubit technologies can provide the basis for the one or more qubits of the one or more quantum computers 108. For instance, superconducting qubits can be employed by the one or more quantum computers, in which the superconducting qubits (e.g., such as superconducting quantum interference devices "SQUIDs") can be lithographically defined electronic circuits that can be cooled to milli-Kelvin temperatures to exhibit quantized energy levels (e.g., due to quantized states of electronic charge or magnetic flux). Superconducting qubits can be Josephson junction-based, such as transmon qubits and/or the like. Also, superconducting qubits can be compatible with microwave control electronics, and can be utilized with gate-based technology or integrated cryogenic controls.

In one or more embodiments, the communications component 112 can facilitate the sharing of data between the maximum-likelihood decoder component 114 and/or the one or more quantum computers 108, and/or vice versa (e.g., via a direct electrical connection and/or through the one or more networks 104). For example, the one or more quantum computers 108 can share measurement data 126 (e.g., from a syndrome extraction circuit of one or more quantum computers 108) regarding one or more quantum computations.

The system 100 can employ one or more QEC codes 124 (e.g., a topological stabilizer code) to identify, using the measurement data 126 (e.g., syndrome measurements), error-sensitive events that occur in one or more quantum circuits of the one or more quantum computers 108 so that the proper corrections can be applied. For example, the one or more QEC codes 124 can protect quantum information from errors due to quantum noise in order to prepare and/or preserve logical quantum states. For instance, the one or more QEC codes 124 can analyze measurement data 126 (e.g., syndrome measurement datasets) from the one or more quantum computers 108, where error-sensitive events can be linear combinations of syndrome measurement bits that would equate to zero in an ideal quantum circuit operation of the one or more quantum computers 108. A non-zero error-sensitive event can be indicative of an error in the quantum circuit of the one or more quantum computers 108. For instance, the error can be a Pauli error occurring: after a gate of the quantum circuit, after an idle of the quantum circuit, after initialization of the quantum circuit, or before a measurement. The Pauli error can be an n-qubit Pauli error if the faulty quantum circuit component acts on "n" qubits (e.g., a 2-qubit Pauli error can occur after 2-qubit gates). Thus, the error-sensitive events can depend on the topology of the quantum circuit of the quantum computers 108, as characterized by a geometric lattice.

Figure 2:
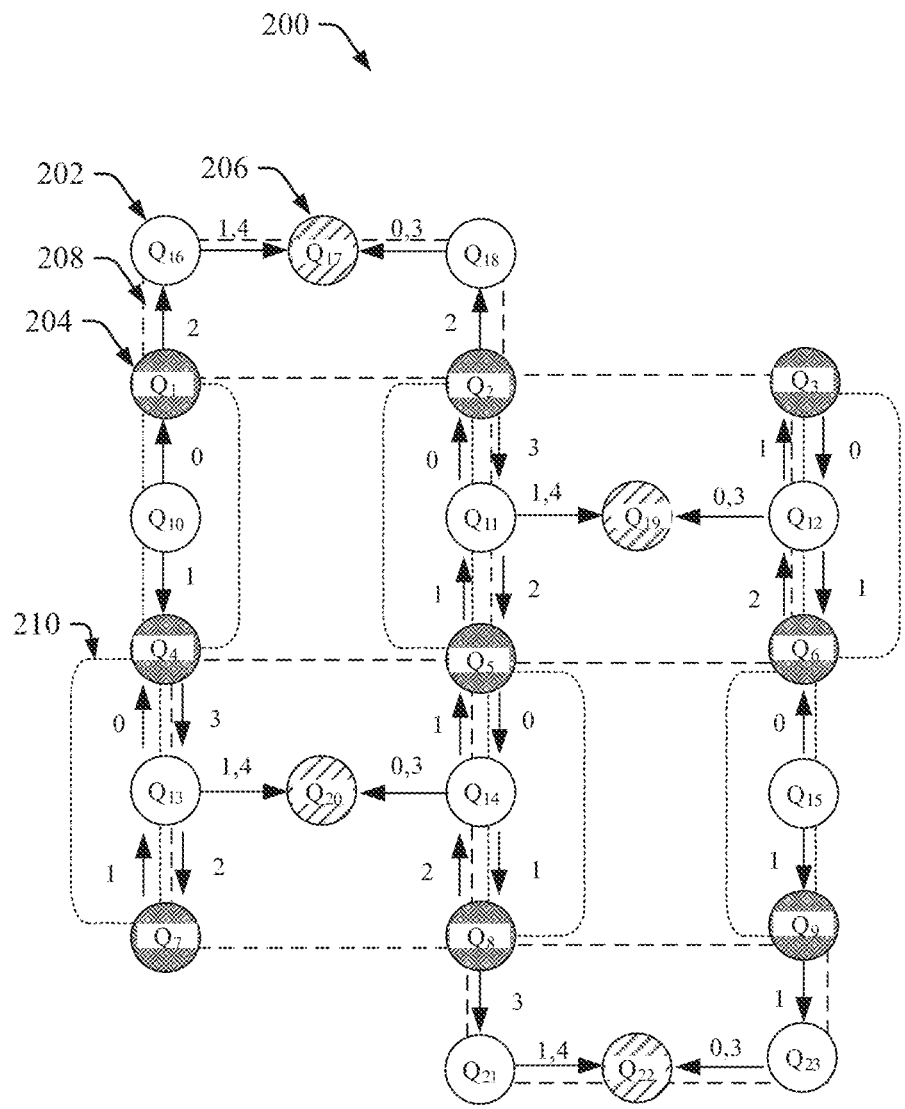
FIG. 2 illustrates a diagram of an example, non-limiting heavy-hexagon layout that can be utilized with a QEC code for executing quantum computation on a quantum circuit in accordance with one or more embodiments described herein.

FIG. 2 illustrates a diagram of an example, non-limiting heavy-hexagon layout 200 for an exemplary QEC code 124 that can characterize qubit connectivity of one or more quantum circuits of the one or more quantum computers 108 in accordance with various embodiments described herein. Repetitive description of like elements employed in other embodiments described herein is omitted for the sake of brevity. Various embodiments described herein can regard one or more quantum circuits having superconducting qubit connectivity characterized by a geometric lattice, which can improve fidelity of quantum operations by mitigating crosstalk.

For example, the heavy-hexagon layout 200 can enable fault-tolerant operations that employ intermediary, flag qubits 202 (e.g., qubits $Q_{10}$-$Q_{16}$, $Q_{18}$, $Q_{21}$, and/or $Q_{23}$) in FIG. 2), to mediate interactions between data qubits 204 (e.g., qubits $Q_1$-$Q_9$ in FIG. 2) and syndrome qubits 206 (e.g., qubits $Q_{17}$, $Q_{19}$, $Q_{20}$, and/or $Q_{23}$ in FIG. 2). For example, the flag qubits 202 can be employed to identify error-sensitive events associated with high-weight errors originating from low-weight errors to facilitate one or more error decoding algorithms. Further, flag qubits 202 can extend the effective distance of a QEC code 124 and enable optimized efficiency at detecting and/or correcting errors. As shown in FIG. 2, the exemplary heavy-hexagon layout 200 can regard an n=9 qubit code with a minimum distance of 3 (e.g., d=3). Additionally, the Z and X gauge and stabilizer groups can be defined by Equations 1-4 below.

$$G_Z = \langle Z_1 Z_2, Z_2 Z_3 Z_5 Z_6, Z_4 Z_5 Z_7 Z_8, Z_8 Z_9 \rangle \quad (1)$$

$$G_X = \langle X_1 X_4, X_2 X_5, X_3 X_6, X_4 X_7 X_5 X_8, X_6 X_9 \rangle \quad (2)$$

$$S_Z = \langle Z_1 Z_2 Z_4 Z_5 Z_7 Z_8, Z_2 Z_3 Z_5 Z_6 Z_8 Z_9 \rangle \quad (3)$$

$$S_X = \langle X_1 X_2 X_4 X_5, X_3 X_6, X_4 X_7, X_5 X_6 X_8 X_9 \rangle \quad (4)$$

The dashed lines 208 illustrated in FIG. 2 map the Z gauge operators onto the example heavy-hexagon layout 200. Also, the dotted lines 210 illustrated in FIG. 2 map the X gauge operators onto the example heavy-hexagon layout 200. Additionally, the order and direction that quantum CX gates can be applied within each sub-section (e.g., with values from 0 to 4) are denoted by number arrows between qubits in FIG. 2.

Figure 3:
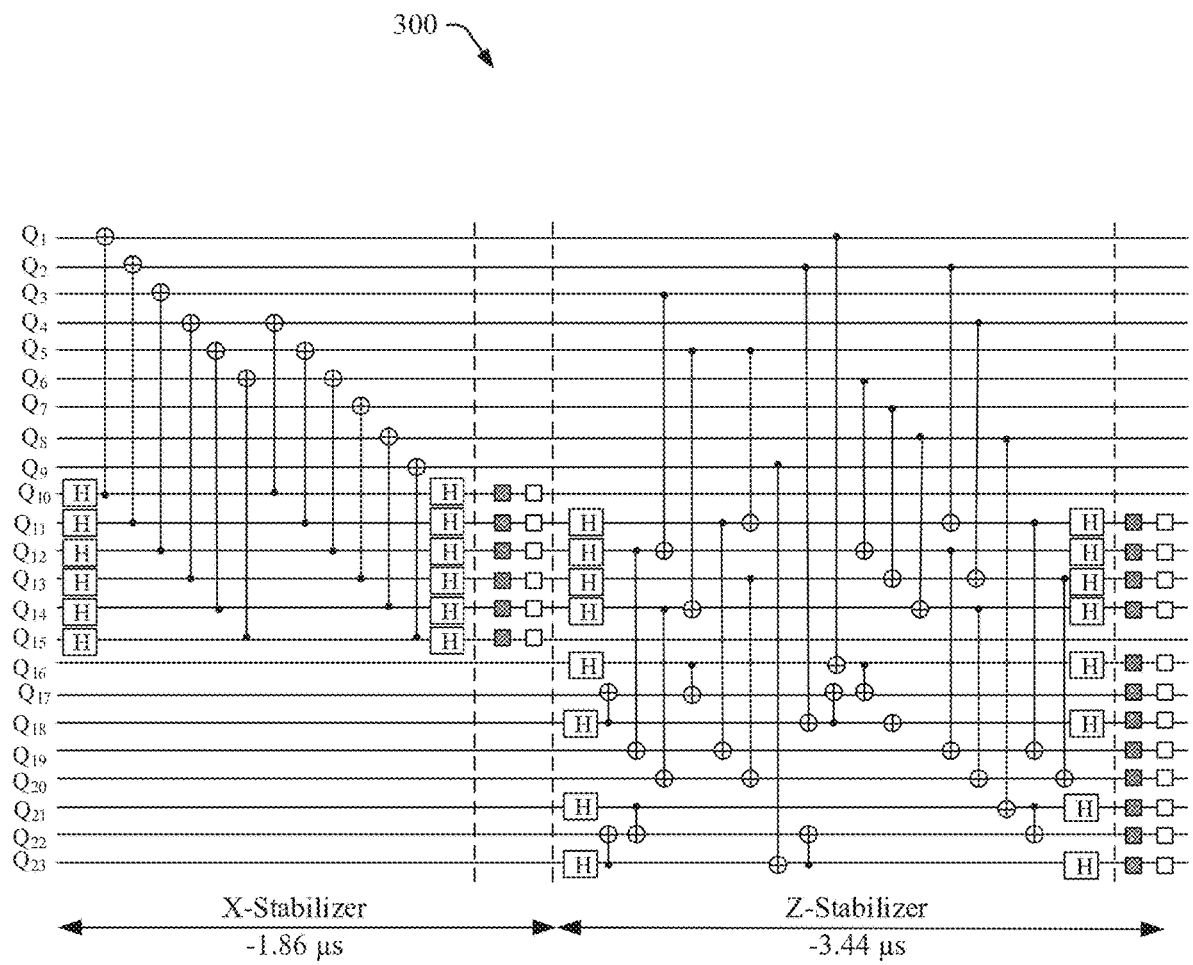
FIG. 3 illustrates a diagram of an example, non-limiting circuit diagram of a quantum circuit that can be implemented with a round of error correction in accordance with one or more embodiments described herein.

In association with the example heavy-hexagon layout 200, FIG. 3 illustrates a diagram of an example, quantum circuit 300 that can be employed by the one or more quantum computers 108 in accordance with various embodiments described herein. Repetitive description of like elements employed in other embodiments described herein is omitted for the sake of brevity. For instance, FIG. 3 can depict the exemplary quantum circuit 300 with regards to one error correction round, including both the X and Z stabilizers. As shown in FIG. 3, two sub-circuits can be employed to measure the X and Z gauge operators. Additionally, the Z gauge measurement sub-circuit can also acquire measurement data 126 by measuring the flag qubits 202.

Code states can be prepared in the logical $|0\rangle$ $(|+\rangle)$ state by first preparing the nine data qubits 204 in the $|0\rangle^{\otimes 9}$ $(|+\rangle^{\otimes 9})$ state and measuring the X and/or Z gauge. Subsequently, one or more rounds r of gauge measurements can be performed, where a round can consist of a Z gauge measurement followed by an X gauge measurement (e.g., and then an X gauge measurement followed by a Z gauge measurement). Further, the one or more quantum computers 108 can perform a readout of the nine code qubits in the Z (X) basis. Additionally, the initial logical states $|1\rangle$ and $|-\rangle$ can also be achieved by initializing the nine qubits in $|1\rangle^{\otimes 9}$ and $|-\rangle^{237\ 9}$.

In various embodiments, one or more QEC codes 124 can be executed with one or more quantum computers 108 on fault-tolerant quantum circuits, such as circuits exemplified by the example heavy-hexagon layout 200 and/or quantum circuit 300 diagram. In executing the quantum operations, the quantum computers 108 can generate measurement data 126 (e.g., syndrome measurements) that can be analyzed by the maximum-likelihood decoder component 114. In accordance with various embodiments described herein, and elaborated upon further below, the maximum-likelihood decoder component 114 can determine one or more error corrections to the qubits and/or measurement data 126 to remedy one or more errors measured in the quantum computations.

Further, various embodiments described herein can be demonstrated in multiple examples via a repeated error detection and correction of a QEC code 124 (e.g., an error-detecting topological stabilizer code) on a device designed to mitigate the limiting effects of cross-talk using flag qubits 202. For instance, the various examples described herein can be demonstrated on a heavy-hexagonal lattice with a code distance value of three. However, the various embodiments described herein can be immediately extended to operate larger distance versions of the fault-tolerant protocols executed on the heavy-hexagon lattice used herein. Additionally, although the distance-3 version is implemented on a subset of the qubits within a larger heavy-hexagon quantum circuit, other topologies can benefit from the quantum decoding protocols described herein. For example, a heavy-square topology akin to the rotated surface code with added flag qubits 202. Additionally, the probabilistic error correction methods and higher order error correlation analysis described herein can be implemented on quantum decoders with regards to quantum circuit topologies with or without flag qubits 202.

Figure 4:
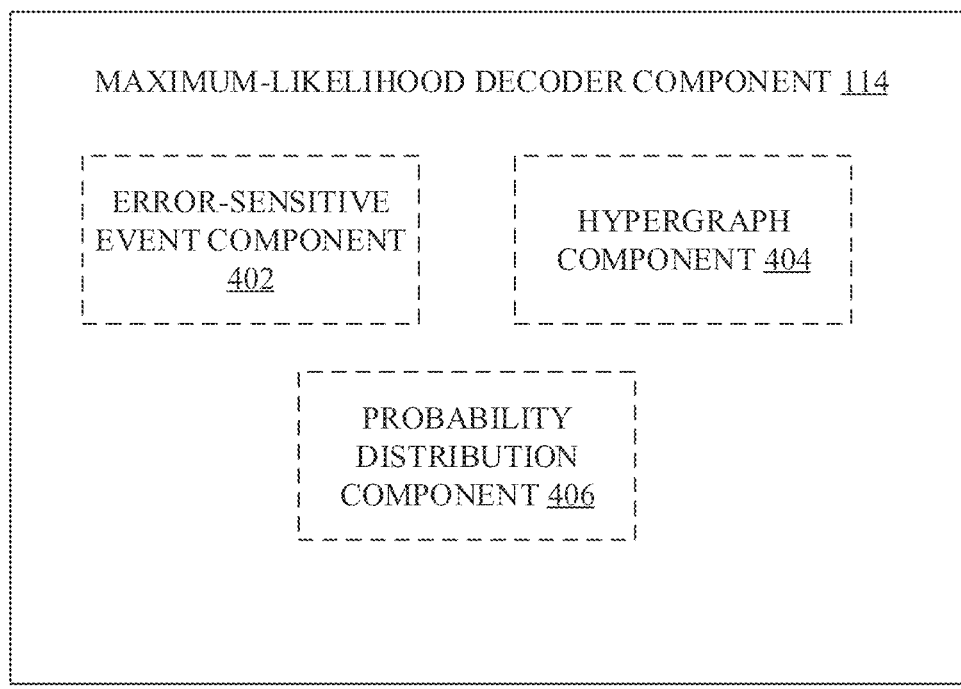
FIG. 4 illustrates a block diagram of an example, non-limiting maximum-likelihood decoder component that can execute a maximum-likelihood decoding algorithm to determine an error correction based on a decoding hypergraph in accordance with one or more embodiments described herein.

FIG. 4 illustrates a diagram of the example, non-limiting maximum-likelihood decoder component 114 comprising error-sensitive event component 402, hypergraph component 404, and/or probability distribution component 406. Repetitive description of like elements employed in other embodiments described herein is omitted for the sake of brevity. In various embodiments, the error-sensitive event component 402 can identify error-sensitive events experienced by a quantum circuit executing a QEC code 124 by performing a Gottesman-Knill simulation of the quantum circuit.

For instance, the error-sensitive event component 402 can analyze the measurement data 126 to identify an error-sensitive event for a measurement outcome m∈{0,1} that is determined by a function of one or more previous measurement outcomes M (e.g., $m=F_m(M)$, where $F_m$ can be determined by simulation of the quantum circuit free of errors). The value of the event can be defined to be $m-F_m(M)$, which can be zero in the absence of errors in the quantum computation. Measuring a non-zero value correlates to an error-sensitive event and can be indicative that the quantum circuit suffered at least one error. Additionally, measurements of a stabilizer of the quantum circuit can be determined by adding together measurements of the constituent gauge operators. With regards to the example heavy-hexagon layout 200, there can be at least two types of error-sensitive events: (1) the difference of two subsequent measurements of the same stabilizer, and (2) flag qubit measurements In various embodiments, the hypergraph component 404 can generate one or more decoding hypergraphs by mapping the identified error-sensitive events to one or more faults of the quantum circuit execution. The one or more decoding hypergraphs can comprise: one or more vertices V, which can correspond to respective error-sensitive events; and/or hyperedges E. The one or more hyperedges E can encode the correlations between error-sensitive events caused by errors in the quantum circuit.

The hypergraph component 404 can populate the one or more decoding hypergraphs by considering one or more quantum circuit faults. For example, one or more noise models 122 (e.g., supplied via the one or more input devices 106 and/or retrieved from one or more digital repositories) can delineate fault probabilities $p_c$ for one or more quantum circuit components C, such as those characterized in Equation 5 below.

$$c \in \{cx, h, id, idm, x, y, z, measure, initialize, reset\} \quad (5)$$

Where "cx" can represent, for example, a control-X quantum gate, "h" can represent a Hadamard gate, "id" can represent an identity operation on qubits during a time when other qubits are undergoing unitary gates, "idm" can represent an identity operation on qubits when other qubits are undergoing measurement and reset, "x", "y", "z" can respectively represent Pauli operators, "measure" can represent a measurement operation, "initialize" can represent an initialization operation, and/or "reset" can represent a reset operation.

In various embodiments, the hypergraph component 404 can utilize the noise model 122 to trace Pauli errors through the quantum circuit to determine the error-sensitive event trigger. For example, a Pauli depolarizing noise model can be employed by the hypergraph component 404 to facilitate the tracing. In various embodiments, error-sensitive events can be detected from qubit measurements (e.g., included in the measurement data 126) via stabilizer measurements, flag qubits, gauge measurements, readout operations, a combination thereof, and/or the like. For instance, a qubit initialization, gate, idle location, or measurement can suffer a fault, in which the fault can be followed or preceded by a Pauli P acting on the same number of qubits as the quantum circuit. Initializations and/or measurements can suffer X errors, while 1-and 2- qubit cases can suffer an error from the 1- or 2-qubit Pauli groups. For instance, consider a set of Pauli errors that can result from single faults in a syndrome measurement circuit. For each Pauli error in the set, the noise model 122 can propagate the fault through the quantum circuit and determine the set of error-sensitive events that can be associated with the error. Thereby, the set can become a hyperedge in the decoding hypergraph. At a first order, the probability of the hyperedge can be sum of probabilities of the faults that can cause the hyperedge.

The detection of an error-sensitive event (e.g., via an analysis of the measurement data 126 by the error-sensitive event component 402) can provoke a control signal to the maximum-likelihood decoder component 114, and/or associate components thereof, to determine an error correction for the measured error-sensitive event. To facilitate a determination of the error correction, each error can lead to a hyperedge in the decoding hypergraph, and/or each hyperedge can be correlated to a triggering of one or more error-sensitive events. Additionally, each hyperedge can be associated with a coset of a normalizer group N(S), which can delineate one or more correction operations to be employed by a maximum-likelihood decoder algorithm of the maximum-likelihood decoder component 114. Thereby, tracing the Pauli fault errors through the quantum circuit can also determine the coset in which the error lies. For initialization and/or reset errors, a Pauli X can be applied with respective probabilities after the ideal state preparation. For measurement errors, Pauli X can be applied with probability $P_{measure}$ before the ideal measurement.

When a single fault occurs in the circuit, it can cause some subset of error-sensitive events to be non-trivial. This set of error-sensitive events can thus become a hyperedge. The set of all hyperedges can be defined as E. Two different faults can lead to the same hyperedge; thus, each hyperedge can be a representation of a set of faults, each of which can individually cause the events in the hyperedge to be non-trivial. Additionally, the hypergraph component 404 can assign a probability to each hyperedge, which, at a first order, can be the sum of the probabilities of faults in the set.

A fault may also lead to an error which, propagated to the end of the quantum circuit, can anti-commute with one or more of the QEC code's 124 logical operators (e.g., the QEC code 124 can comprise k logical qubits and a basis of 2k logical operators). The hypergraph component 404 can track of which logical operators anti-commute with the error using a vector from $\mathbb{Z}_2^{2k}$. Thus, each hyperedge h can also labeled by one of these vectors $\gamma_h \in \mathbb{Z}_2^{2k}$, which can be referred to as a logical label. In various embodiments, where the QEC code 124 can have a distance value at least three, each hyperedge can have a unique logical label.

In various embodiments, the hypergraph component 404 can simplify the one or more decoding hypergraphs. For example, the hypergraph component 404 can execute one or more deflagging operations to simply the one or more decoding hypergraphs. For instance, instead of including error-sensitive events from the flag qubit 202 measurements directly, the hypergraph component 404 can use the flag qubit 202 information to immediately (e.g., before any more gates are applied) apply virtual Pauli Z corrections and adjust subsequent error-sensitive events accordingly. Hyperedges for the deflagged decoding hypergraph can be found through stabilizer simulation incorporating the Z corrections. Additionally, in one or more embodiments, the hypergraph component 404 can simplify the one or more decoding hypergraphs by identifying symmetries regarding vertices and/or hyperedges. Where symmetries are identified, the hypergraph component 404 can compress description of the decoding hypergraph (e.g., by delineated the encompassing the symmetrical components into a common representation).

Figure 5A:
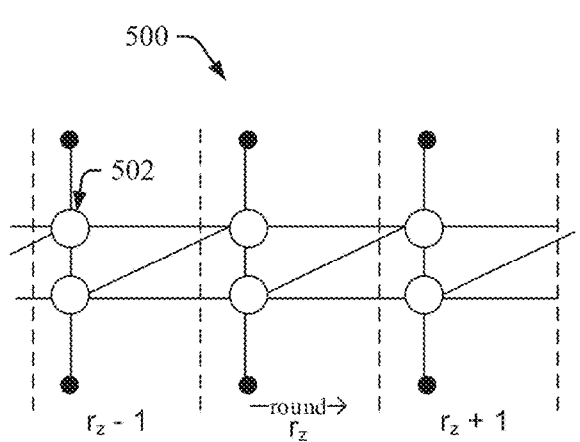
FIGS. 5A-5D illustrate diagrams of an example, non-limiting decoding hypergraph that can be generated by tracing one or more Pauli faults through a quantum circuit in accordance with one or more embodiments described herein.
Figure 5B:
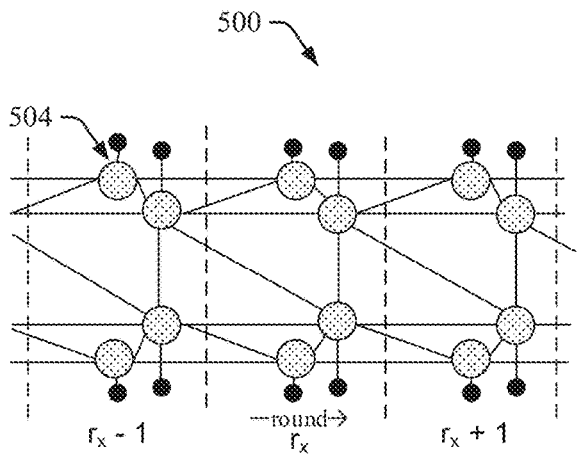
Figure 5C:
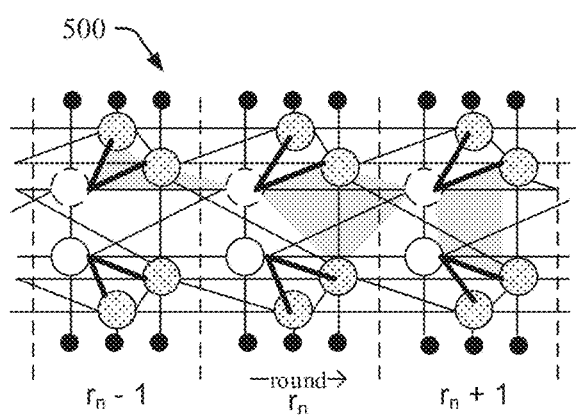
Figure 5D:
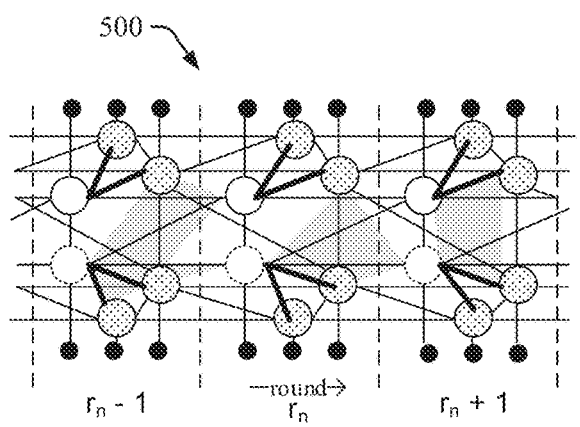

FIGS. 5A-5D illustrate diagrams of examples, of one or more non-limiting decoding hypergraphs 500 that can be generated by the hypergraph component 404 based on tracing Pauli fault errors through a quantum circuit in accordance with one or more embodiments described herein. Repetitive description of like elements employed in other embodiments described herein is omitted for the sake of brevity. FIGS. 5A-5D can depict example decoding hypergraphs 500 for three rounds of execution on a quantum circuit. For example, FIG. 5A can depict the three rounds (e.g., delineated by "r", where the present round is denoted by "n") with regards to Z stabilizer measurements for an exemplary heavy-hexagon QEC code 124 with a code distance of three. FIG. 5B can depict the three rounds with regards to Z stabilizer measurements for the exemplary heavy-hexagon QEC code 124 with a code distance of three. The first nodes 502 (e.g., represented by white circles) of the exemplary decoding hypergraphs 500 can correlate to Z stabilizers. The second nodes 504 (e.g., represented by patterned circles) of the exemplary decoding hypergraphs 500 can correlate to X stabilizers. The lines between the first nodes 502 and/or second nodes 504 can represent hyperedges. FIG. 5C can illustrate three size-4 hyperedges involving the top Z-stabilizer (e.g., first nodes 502 characterized by dashed lines in FIG. 5C). FIG. 5D can illustrate three size-4 hyperedges involving the bottom Z-stabilizer (e.g., first nodes 502 characterized by dotted lines in FIG. 5D).

In various embodiments, the probability distribution component 406 can generate a probability distribution of the probability values associated with hyperedges of the one or more decoding hypergraphs. The probability distribution can comprise one or more entries that are indexed by an error-sensitive event bit string (e.g., a bit string describing the given error-sensitive event) and a coset bit string (e.g., a bit string specifying the associate normalizer group coset N(S)). For example, the probability distribution component 406 can determine the probability distribution $\Pr[\beta\gamma]$, where $\beta \in \mathbb{Z}_2^{|V|}$ can represent error-sensitive events (e.g., where V can be a set of vertices from the one or more decoding hypergraphs) and $\gamma \in \mathbb{Z}_2^{2k}$ can represent a logical correction. For example, $\gamma \in \mathbb{Z}_2^{2k}$ can delineate to which coset the measured error belongs. Further, a determination of what stabilizer an error on the code qubits belongs to can be characterized by $\alpha \in \mathbb{Z}_2^{n-k}$. The probability distribution component 406 can calculate $\Pr[\beta\gamma]$ by including each hyperedge from the one or more decoding hypergraphs (e.g., beginning from the zero-error distribution, which can be defined as $\Pr[0^{|V|}0^{2k}]=1$. For instance, where a hyperedge h has a probability $p_h$ of occurring, independent of another hyperedge, the probability distribution component 406 can include the hyperedge h in the probability distribution by performing an update to the QEC code 124 (e.g., between mid-circuit measurements), as characterized by Equation 6 below.

$$\Pr[\beta\gamma] \leftarrow (1-p_h)\Pr[\beta\gamma] + p_h \Pr[(\beta+\beta_h)(\gamma+\gamma_h)] \quad (6)$$

Where $\beta_h \in \mathbb{Z}_2^{|V|}$ can be a binary vector representation of the hyperedge. Additionally, the update can be applied for each hyperedge included in a set of hyperedges E.

Based on the probability distribution $\Pr[\beta\gamma]$, the maximum-likelihood decoder component 114 can determine an optimal correction associated with a measured error-sensitive event. For instance, where $\beta^* \in \mathbb{Z}_2^{|V|}$ is observed from the measurement data 126 from an execution of the quantum circuit on the one or more quantum computers 108, the maximum-likelihood decoder component 114 can determine one or more optimal corrections to logical operators of the QEC code 124 in accordance with Equation 7 below.

$$\gamma^* = \mathrm{argmax}_\gamma \Pr[\beta^*\gamma] \quad (7)$$

For instance, by tracking the probability distribution $\Pr[\beta\gamma]$, the maximum-likelihood decoder component 114 can perform an update for each hyperedge, which can represent a collection of Pauli faults with the same $\beta$, $\gamma$.

In various embodiments, the maximum-likelihood decoder component 114 can execute a maximum-likelihood decoding algorithm that identifies the largest entry of the probability distribution that is consistent with an observed (e.g., measured) error-sensitive event. Thereby, the identified entry can delineate the most likely error (e.g., Pauli fault) associated with the error-sensitive event measured from the measurement data 126. Further, the maximum-likelihood decoding algorithm can identify the normalizer group coset associated with the identified entry as the optimal correction to the QEC code 124 to be employed by the maximum-likelihood decoder component 114.

In one or more embodiments, the probability distribution component 406 can generate and store (e.g., within the one or more memories 116) an entirety of the probability distribution $\Pr[\beta\gamma]$ characterized by the one or more decoding hypergraphs, where the maximum-likelihood decoder component 114 can query the entirety of the probability distribution to determine one or more corrections to the QEC code 124 for each execution of the quantum circuit. For instance, for each execution of the quantum circuit, the maximum-likelihood decoder component 114 can execute a maximum likelihood decoding algorithm to analyze and/or update each hyperedge included in the one or more decoding hypergraphs until all, or substantially all, the hyperedges have been analyzed.

Alternatively, in one or more embodiments, the probability distribution component 406 can truncate the probability distribution to calculate distributions specific to each measured bit string $\beta^*$ in the measurement data 126. For example, the probability distribution component 406 can prune the probability distribution as corrections are performed to the QEC code 124, while maintaining those entries that are consistent with $\beta^*$. For instance, bit strings $\beta^*$ can be analyzed sequentially one at a time. For the $j^{th}$ bit string, the probability distribution component 406 can determine the segment of the probability distribution to generate in accordance with Equation 6 for those hyperedges that contain bit j and have not already been included. In one or more embodiments, the corrections for a given bit string can be combined into a pre-calculated transition matrix. Since no further corrections will be made to bit j, the probability distribution component 406 can truncate the probability distribution by keeping only those entries of $\Pr[\beta\gamma]$ where $\beta_j = \beta^*_j$.

When determining the subset of the probability distribution, there can be a maximum instantaneous size $S_{max}$ of the probability distribution, where the total time to determine a correction can be characterized as proportional to $|V|S_{max}$ per execution of the quantum circuit. $S_{max}$ can depend on the one or more decoding hypergraphs and/or the order in which the error-sensitive events are incorporated. For example, for $[\![n, k]\!]$ QEC codes 124, repeated rounds of stabilizer measurements, and events incorporated chronologically, $S_{max}$ can be characterized by Equation 8 below (e.g., where hyperedges do not span more than two rounds of error-sensitive events).

$$2^{n+k} \leq S_{max} \leq 2^{2n} \quad (8)$$

Additionally, the probability distribution component 406 can be amenable to dynamic programming, storing partially calculated probability distributions up to some moderately-sized j. For instance, for three rounds of execution the example quantum circuit 300, the probability distribution component 406 can store probability distributions up to j=15; while for four rounds of execution the probability distribution component 406 can store probability distributions up to j=21.

Figure 6:
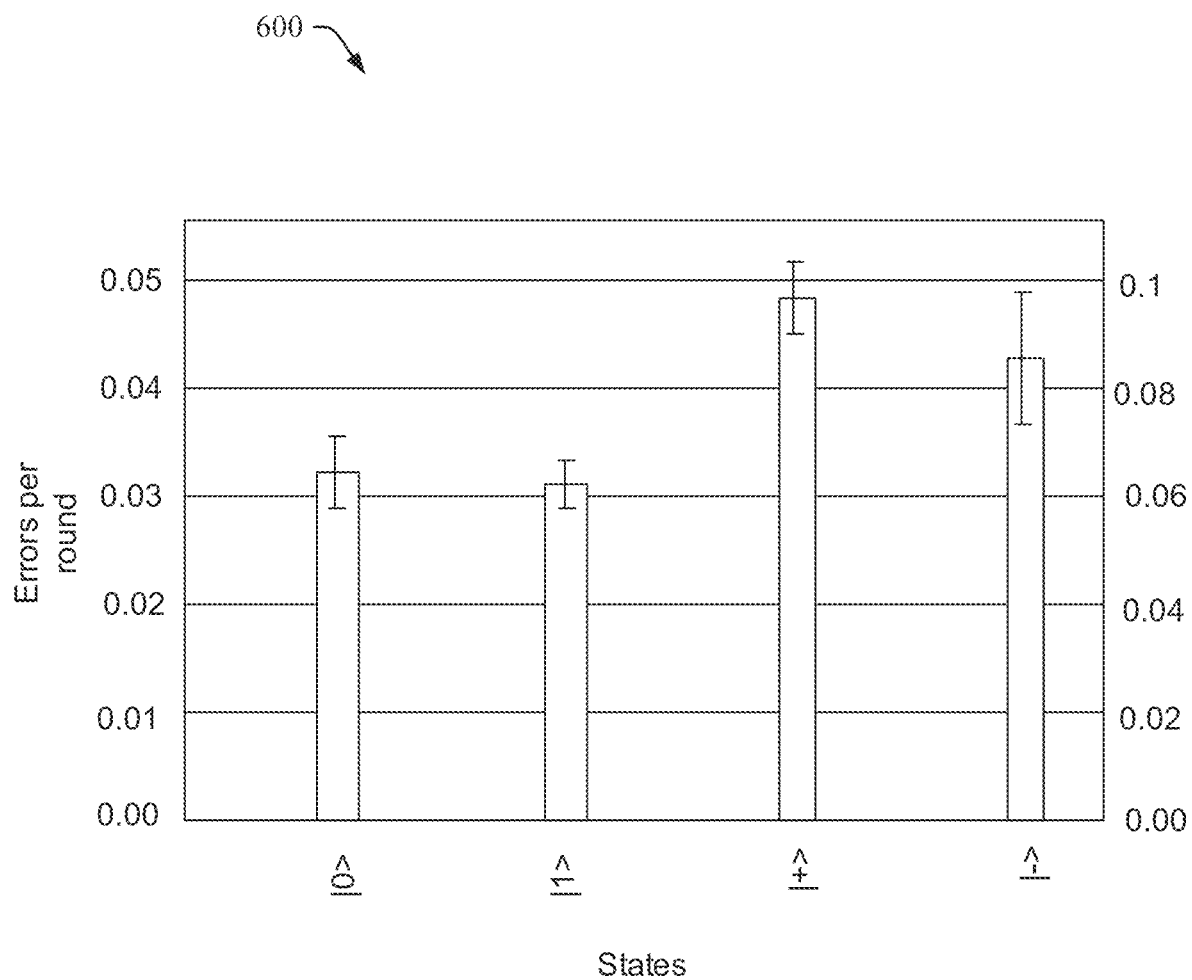
FIG. 6 illustrates a diagram of an example, non-limiting graph that can demonstrate fitted errors per round experienced by a quantum circuit, where a maximum-likelihood decoder algorithm can be employed to determine error corrections in accordance with one or more embodiments described herein.

FIGS. 6-7 illustrate diagrams of an example, non-limiting graph 600 and/or table 700 depicting experiment data demonstrating the efficacy of the maximum-likelihood decoder component 114 in accordance with various embodiments described herein. Repetitive description of like elements employed in other embodiments described herein is omitted for the sake of brevity. The heavy-hexagon layout 200 and/or quantum circuit 300 diagram was employed to achieve the experiment data. The circuit diagram illustrates permitted parallelization of gate operations as set by barriers. As each two qubit gate duration can differ, the final gate scheduling can be determined with a standard circuit transpilation pass. The total time for qubit measurement and subsequent real-time conditional reset, for each stabilizer round, can take, for example, 768 nanoseconds and can be the same for all qubits. The syndrome measurements and/or resets can occur simultaneously for improved performance. As the final step, a simple $X_\pi$-$X_\pi$ dynamical decoupling sequence can be added to all data qubits during their respective idling periods. Graph 600 shows the logical error rate per round using the maximum-likelihood decoder component 114. The error rates shown in FIG. 6 were fitted using round N=0 to 4, with error bars denoting one standard deviation of the fitting parameter.

As shown in FIG. 7, "uniform" can represent utilization of a quantum decoder that employs a decoding graph with uniform edge weights, that does not consider probability distributions, and/or does not execute a maximum-likelihood decoding algorithm (e.g., as employed in various embodiments described herein). Also, "RB" can represent utilization of a quantum decoder that utilizes random benchmarking to estimate noise parameters and estimate corrections. In table 700, "maximum-likelihood decoder component 114" represents experimental data achieved utilizing the maximum-likelihood decoder component 114 described in various embodiments herein. Table 700 depicts experiment data (e.g., logical error rates express as percentage) from various executions (e.g., "Job") of a heavy-hexagon code (e.g., utilizing heavy-hexagon layout 200 and/or quantum circuit 300) with a code distance value of three and three cycles of syndrome measurement data 126.

Figure 8:
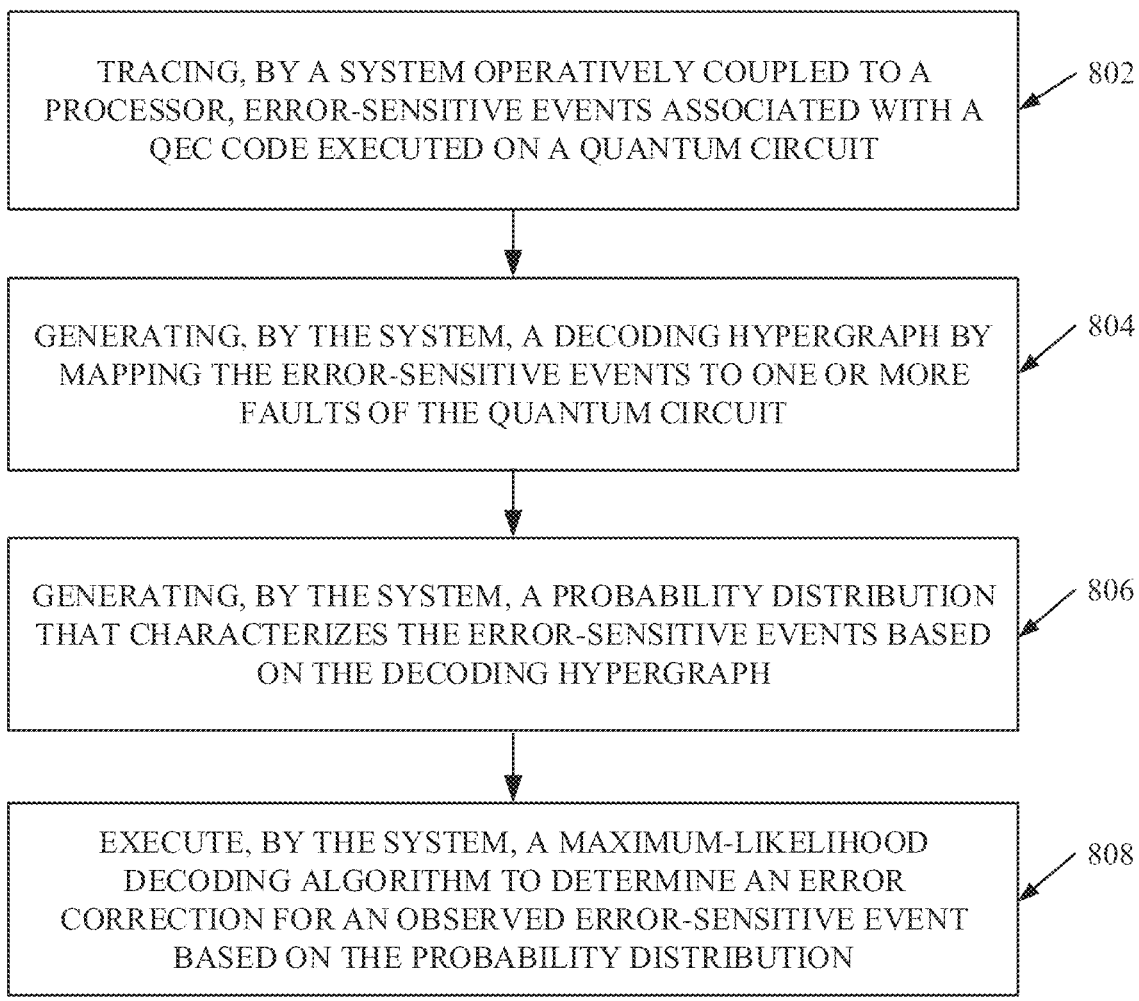
FIG. 8 illustrates a flow diagram of an example, non-limiting computer-implemented method for determining an error correction based on a decoding hypergraph in accordance with one or more embodiments described herein.

FIG. 8 illustrates a flow diagram of an example, non-limiting computer-implemented method 800 that can be employed by the maximum-likelihood decoder component 114 to perform one or more quantum error correction protocols in accordance with various embodiments described herein. Repetitive description of like elements employed in other embodiments described herein is omitted for the sake of brevity.

At 802, computer-implemented method 800 can comprise tracing (e.g., via error-sensitive event component 402), by the system 100 operatively coupled to a processor 120, one or more error-sensitive events associated with a QEC code 124 executed on one or more quantum circuits (e.g., via one or more quantum computers 108). At 804, the computer-implemented method 800 can comprise generating (e.g., via hypergraph component 404), by the system 100, one or more decoding hypergraphs by mapping the error-sensitive events to one or more faults (e.g., Pauli faults) of the quantum circuit. For example, the one or more decoding hypergraphs can comprise one or more nodes representing error-sensitive events and/or one or more hyperedges that can correlate faults to the error-sensitive events. Additionally, one or more probability values and/or normalizer group cosets (e.g., delineating one or more corrections that can remedy the associate error-sensitive event).

At 806, the computer-implemented method 800 can comprise generating (e.g., via probability distribution component 406), by the system 100, one or more probability distributions that can characterize the error-sensitive events based on the one or more decoding hypergraphs. As described herein, the probability distribution can be generated with regards to all the hyperedges of the one or more decoding hypergraphs and/or the probability distribution can be simplified by removing entries that are not consistent with an observed set of error-sensitive events. At 808, the computer-implemented method 800 can comprise executing (e.g., via maximum-likelihood decoder component 114), by the system 100, a maximum-likelihood decoding algorithm to determine an error correction for an observed error-sensitive event based on the probability distribution. For example, the maximum-likelihood decoding algorithm identify an entry of the probability distribution with the largest probability value and consistent with an observe error-sensitive event. Further, the coset of the identified entry can indicate the error correction. Executing, by the system 100, can further include providing instructions to quantum computer 108 to cause the quantum computer 108 to provide an appropriate control pulse to perform the error correction on the quantum computer 108.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 9:
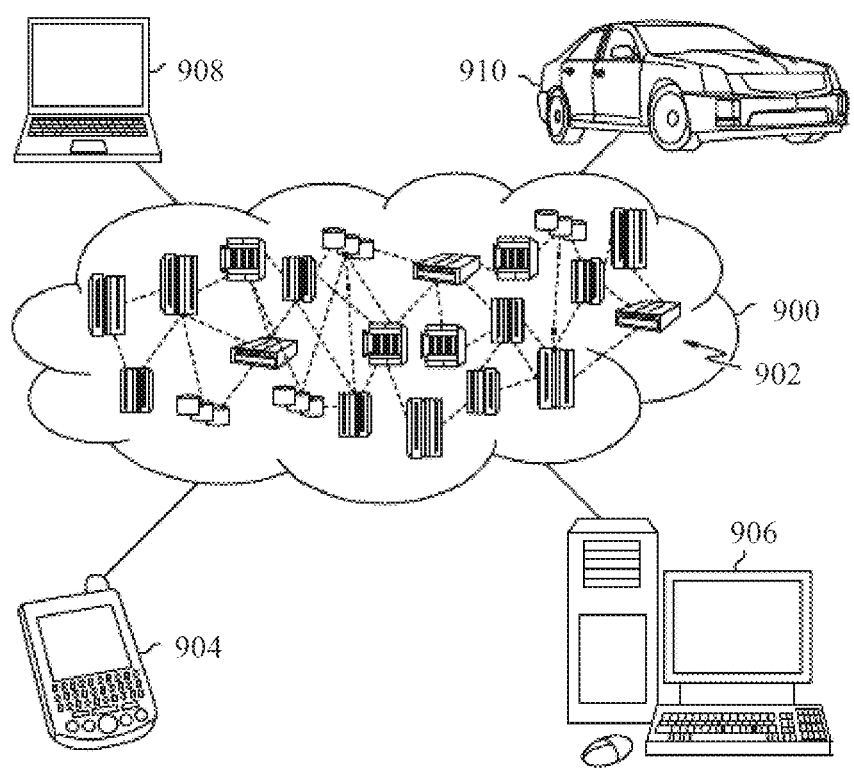
FIG. 9 depicts a cloud computing environment in accordance with one or more embodiments described herein.

Referring now to FIG. 9, illustrative cloud computing environment 900 is depicted. As shown, cloud computing environment 900 includes one or more cloud computing nodes 902 with which local computing devices used by cloud consumers, such as, for example, personal digital assistant (PDA) or cellular telephone 904, desktop computer 906, laptop computer 908, and/or automobile computer system 910 may communicate. Nodes 902 may communicate with one another. They may be grouped (not shown) physically or virtually, in one or more networks, such as Private, Community, Public, or Hybrid clouds as described hereinabove, or a combination thereof. This allows cloud computing environment 900 to offer infrastructure, platforms and/or software as services for which a cloud consumer does not need to maintain resources on a local computing device. It is understood that the types of computing devices 904-910 shown in FIG. 9 are intended to be illustrative only and that computing nodes 902 and cloud computing environment 900 can communicate with any type of computerized device over any type of network and/or network addressable connection (e.g., using a web browser).

Figure 10:
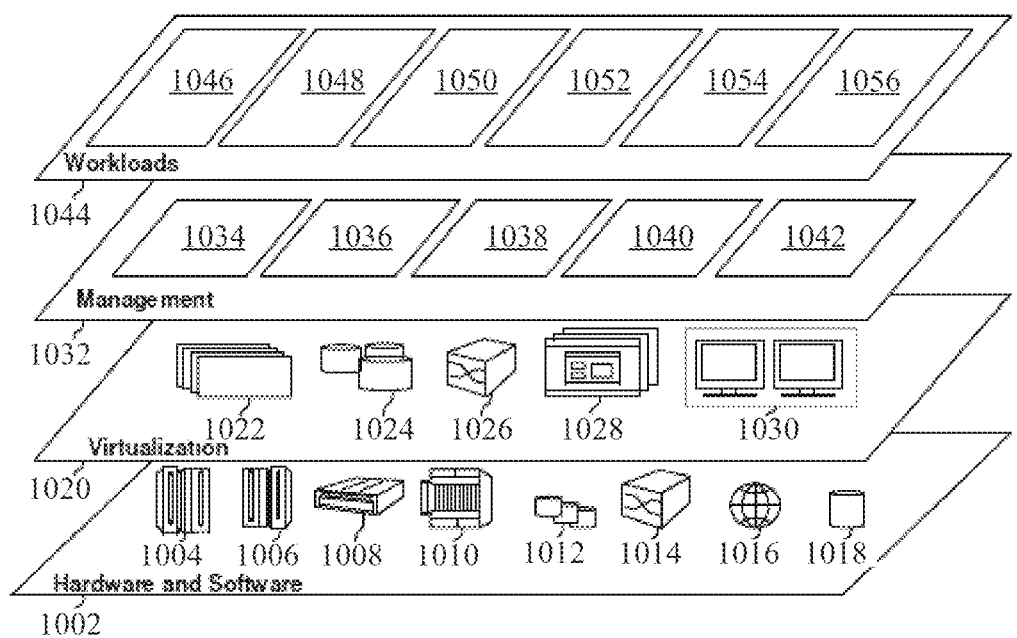
FIG. 10 depicts abstraction model layers in accordance with one or more embodiments described herein

Referring now to FIG. 10, a set of functional abstraction layers provided by cloud computing environment 900 (FIG. 9) is shown. Repetitive description of like elements employed in other embodiments described herein is omitted for the sake of brevity. It should be understood in advance that the components, layers, and functions shown in FIG. 10 are intended to be illustrative only and embodiments of the invention are not limited thereto. As depicted, the following layers and corresponding functions are provided.

Hardware and software layer 1002 includes hardware and software components. Examples of hardware components include: mainframes 1004; RISC (Reduced Instruction Set Computer) architecture based servers 1006; servers 1008; blade servers 1010; storage devices 1012; and networks and networking components 1014. In some embodiments, software components include network application server software 1016 and database software 1018.

Virtualization layer 1020 provides an abstraction layer from which the following examples of virtual entities may be provided: virtual servers 1022; virtual storage 1024; virtual networks 1026, including virtual private networks; virtual applications and operating systems 1028; and virtual clients 1030.

In one example, management layer 1032 may provide the functions described below. Resource provisioning 1034 provides dynamic procurement of computing resources and other resources that are utilized to perform tasks within the cloud computing environment. Metering and Pricing 1036 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1038 provides access to the cloud computing environment for consumers and system administrators. Service level management 1040 provides cloud computing resource allocation and management such that required service levels are met. Service Level Agreement (SLA) planning and fulfillment 1042 provide pre-arrangement for, and procurement of, cloud computing resources for which a future requirement is anticipated in accordance with an SLA.

Workloads layer 1044 provides examples of functionality for which the cloud computing environment may be utilized. Examples of workloads and functions which may be provided from this layer include: mapping and navigation 1046; software development and lifecycle management 1048; virtual classroom education delivery 1050; data analytics processing 1052; transaction processing 1054; and quantum error correction 1056. Various embodiments of the present invention can utilize the cloud computing environment described with reference to FIGS. 9 and 10 to execute a maximum-likelihood decoding algorithm that determines an error correction based on a decoding hypergraph that characterizes error-sensitive events associated with a quantum error-correcting code executed on a quantum circuit.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware based systems that perform the specified functions or acts or carry out combinations of special purpose hardware and computer instructions.

Figure 11:
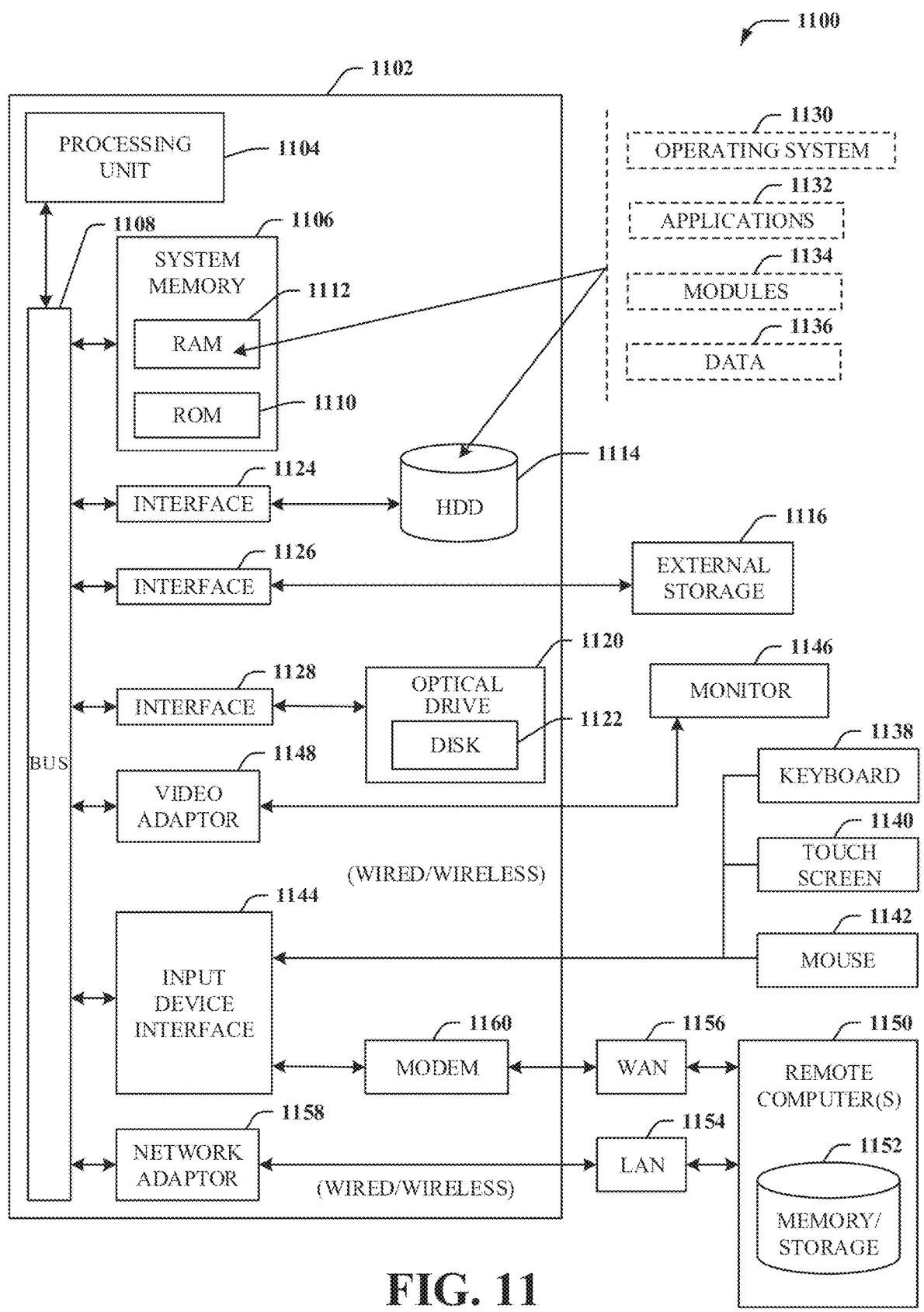
FIG. 11 illustrates a block diagram of an example, non-limiting operating environment in which one or more embodiments described herein can be facilitated.

In order to provide additional context for various embodiments described herein, FIG. 11 and the following discussion are intended to provide a general description of a suitable computing environment 1100 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, and/or the like, that perform particular tasks or implement particular abstract data types. Moreover, those skilled in the art will appreciate that the inventive methods can be practiced with other computer system configurations, including single-processor or multi-processor computer systems, minicomputers, mainframe computers, Internet of Things ("IoT") devices, distributed computing systems, as well as personal computers, handheld computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory ("RAM"), read only memory ("ROM"), electrically erasable programmable read only memory ("EEPROM"), flash memory or other memory technology, compact disk read only memory ("CD-ROM"), digital versatile disk ("DVD"), Blu-ray disc ("BD") or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 11, the example environment 1100 for implementing various embodiments of the aspects described herein includes a computer 1102, the computer 1102 including a processing unit 1104, a system memory 1106 and a system bus 1108. The system bus 1108 couples system components including, but not limited to, the system memory 1106 to the processing unit 1104. The processing unit 1104 can be any of various commercially available processors. Dual microprocessors and other multi-processor architectures can also be employed as the processing unit 1104.

The system bus 1108 can be any of several types of bus structure that can further interconnect to a memory bus (with or without a memory controller), a peripheral bus, and a local bus using any of a variety of commercially available bus architectures. The system memory 1106 includes ROM 1110 and RAM 1112. A basic input/output system ("BIOS") can be stored in a non-volatile memory such as ROM, erasable programmable read only memory ("EPROM"), EEPROM, which BIOS contains the basic routines that help to transfer information between elements within the computer 1102, such as during startup. The RAM 1112 can also include a high-speed RAM such as static RAM for caching data.

The computer 1102 further includes an internal hard disk drive ("HDD") 1114 (e.g., EIDE, SATA), one or more external storage devices 1116 (e.g., a magnetic floppy disk drive ("FDD") 1116, a memory stick or flash drive reader, a memory card reader, a combination thereof, and/or the like) and an optical disk drive 1120 (e.g., which can read or write from a disk 1122, such as: CD-ROM disc, a DVD, a BD, and/or the like). While the internal HDD 1114 is illustrated as located within the computer 1102, the internal HDD 1114 can also be configured for external use in a suitable chassis (not shown). Additionally, while not shown in environment 1100, a solid state drive ("SSD") could be used in addition to, or in place of, an HDD 1114. The HDD 1114, external storage device(s) 1116 and optical disk drive 1120 can be connected to the system bus 1108 by an HDD interface 1124, an external storage interface 1126 and an optical drive interface 1128, respectively. The interface 1124 for external drive implementations can include at least one or both of Universal Serial Bus ("USB") and Institute of Electrical and Electronics Engineers ("IEEE") 1394 interface technologies. Other external drive connection technologies are within contemplation of the embodiments described herein.

The drives and their associated computer-readable storage media provide nonvolatile storage of data, data structures, computer-executable instructions, and so forth. For the computer 1102, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1112, including an operating system 1130, one or more application programs 1132, other program modules 1134 and program data 1136. All or portions of the operating system, applications, modules, and/or data can also be cached in the RAM 1112. The systems and methods described herein can be implemented utilizing various commercially available operating systems or combinations of operating systems.

Computer 1102 can optionally comprise emulation technologies. For example, a hypervisor (not shown) or other intermediary can emulate a hardware environment for operating system 1130, and the emulated hardware can optionally be different from the hardware illustrated in FIG. 11. In such an embodiment, operating system 1130 can comprise one virtual machine ("VM") of multiple VMs hosted at computer 1102. Furthermore, operating system 1130 can provide runtime environments, such as the Java runtime environment or the .NET framework, for applications 1132. Runtime environments are consistent execution environments that allow applications 1132 to run on any operating system that includes the runtime environment. Similarly, operating system 1130 can support containers, and applications 1132 can be in the form of containers, which are lightweight, standalone, executable packages of software that include, e.g., code, runtime, system tools, system libraries and settings for an application.

Further, computer 1102 can be enable with a security module, such as a trusted processing module ("TPM"). For instance with a TPM, boot components hash next in time boot components, and wait for a match of results to secured values, before loading a next boot component. This process can take place at any layer in the code execution stack of computer 1102, e.g., applied at the application execution level or at the operating system ("OS") kernel level, thereby enabling security at any level of code execution.

A user can enter commands and information into the computer 1102 through one or more wired/wireless input devices, e.g., a keyboard 1138, a touch screen 1140, and a pointing device, such as a mouse 1142. Other input devices (not shown) can include a microphone, an infrared ("IR") remote control, a radio frequency ("RF") remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1104 through an input device interface 1144 that can be coupled to the system bus 1108, but can be connected by other interfaces, such as a parallel port, an IEEE 1394 serial port, a game port, a USB port, an IR interface, a BLUETOOTH® interface, and/or the like.

A monitor 1146 or other type of display device can be also connected to the system bus 1108 via an interface, such as a video adapter 1148. In addition to the monitor 1146, a computer typically includes other peripheral output devices (not shown), such as speakers, printers, a combination thereof, and/or the like.

The computer 1102 can operate in a networked environment using logical connections via wired and/or wireless communications to one or more remote computers, such as a remote computer(s) 1150. The remote computer(s) 1150 can be a workstation, a server computer, a router, a personal computer, portable computer, microprocessor-based entertainment appliance, a peer device or other common network node, and typically includes many or all of the elements described relative to the computer 1102, although, for purposes of brevity, only a memory/storage device 1152 is illustrated. The logical connections depicted include wired/wireless connectivity to a local area network ("LAN") 1154 and/or larger networks, e.g., a wide area network ("WAN") 1156. Such LAN and WAN networking environments are commonplace in offices and companies, and facilitate enterprise-wide computer networks, such as intranets, all of which can connect to a global communications network, e.g., the Internet.

When used in a LAN networking environment, the computer 1102 can be connected to the local network 1154 through a wired and/or wireless communication network interface or adapter 1158. The adapter 1158 can facilitate wired or wireless communication to the LAN 1154, which can also include a wireless access point ("AP") disposed thereon for communicating with the adapter 1158 in a wireless mode.

When used in a WAN networking environment, the computer 1102 can include a modem 1160 or can be connected to a communications server on the WAN 1156 via other means for establishing communications over the WAN 1156, such as by way of the Internet. The modem 1160, which can be internal or external and a wired or wireless device, can be connected to the system bus 1108 via the input device interface 1144. In a networked environment, program modules depicted relative to the computer 1102 or portions thereof, can be stored in the remote memory/storage device 1152. It will be appreciated that the network connections shown are example and other means of establishing a communications link between the computers can be used.

When used in either a LAN or WAN networking environment, the computer 1102 can access cloud storage systems or other network-based storage systems in addition to, or in place of, external storage devices 1116 as described above. Generally, a connection between the computer 1102 and a cloud storage system can be established over a LAN 1154 or WAN 1156 e.g., by the adapter 1158 or modem 1160, respectively. Upon connecting the computer 1102 to an associated cloud storage system, the external storage interface 1126 can, with the aid of the adapter 1158 and/or modem 1160, manage storage provided by the cloud storage system as it would other types of external storage. For instance, the external storage interface 1126 can be configured to provide access to cloud storage sources as if those sources were physically connected to the computer 1102.

The computer 1102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, and/or the like), and telephone. This can include Wireless Fidelity ("Wi-Fi") and BLUETOOTH® wireless technologies. Thus, the communication can be a predefined structure as with a conventional network or simply an ad hoc communication between at least two devices.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a memory that stores computer executable components; and
a processor, operably coupled to the memory, and that executes the computer executable components stored in the memory, wherein the computer executable components comprise:
a hypergraph component that:
executes, using a quantum processor comprising qubits, a quantum error-correcting code on a quantum circuit, and
generates a decoding hypergraph by mapping error-sensitive events associated with the executing of the quantum error-correcting code on the quantum circuit to faults of the quantum circuit, wherein the decoding hypergraph comprises:
nodes respectively corresponding to the error sensitive events, and
hyperedges connecting the nodes, and wherein the respective hyperedges correlate the error sensitive events to one or more of the faults that are potential causes of the error sensitive events; and
a maximum-likelihood decoder component that executes a maximum-likelihood decoding algorithm to determine an error correction for an at least one of the error-sensitive events of the quantum circuit based on the decoding hypergraph.

2. The system of claim 1, wherein the error correction comprises a correction to a logic qubit of the quantum error-correcting code given a measured occurrence of an error-sensitive event.

3. The system of claim 2, further comprising:
an error-sensitive event component that deduces the error-sensitive events by performing a Gottesman-Knill simulation of the quantum circuit.

4. The system of claim 1, wherein the quantum processor comprises a heavy-hexagon layout of the qubits.

5. The system of claim 1, further comprising:
a probability distribution component that assigns probability values to the hyperedges and generates a probability distribution analyzed by the maximum-likelihood decoding algorithm.

6. The system of claim 5, wherein the maximum-likelihood decoding algorithm queries an entirety of the probability distribution to determine the error correction for one or more executions of the quantum circuit.

7. The system of claim 5, wherein the maximum-likelihood decoding algorithm queries a subset of the probability distribution associated with an error-sensitive event defined by a given bit string measured from the execution of the quantum circuit.

8. A computer-implemented method, comprising:
executing, by a system operatively coupled to a processor, using a quantum processor comprising qubits, a quantum error-correcting code on a quantum circuit;
generating, by the system, a decoding hypergraph by mapping error-sensitive events associated with the executing of the quantum error-correcting code on the quantum circuit to faults of the quantum circuit, wherein the decoding hypergraph comprises:
nodes respectively corresponding to the error sensitive events, and
hyperedges connecting the nodes, and wherein the respective hyperedges correlate the error sensitive events to one or more of the faults that are potential causes of the error sensitive events; and
executing, by the system, a maximum-likelihood decoding algorithm to determine an error correction for an at least one of the error-sensitive events of the quantum circuit based on the decoding hypergraph.

9. The computer-implemented method of claim 8, wherein the error correction comprises a correction to a logic qubit of the quantum error-correcting code given a measured occurrence of an error-sensitive event.

10. The computer-implemented method of claim 8, further comprising:
tracing, by the system, the error-sensitive events by performing a Gottesman-Knill simulation of the quantum circuit.

11. The computer-implemented method of claim 10, wherein the quantum processor comprises a heavy-hexagon layout of the qubits.

12. The computer-implemented method of claim 8, further comprising:
assigning, by the system, probability values to the hyperedges and generates a probability distribution analyzed by the maximum-likelihood decoding algorithm.

13. The computer-implemented method of claim 12, wherein the maximum-likelihood decoding algorithm queries an entirety of the probability distribution to determine the error correction for one or more executions of the quantum circuit.

14. The computer-implemented method of claim 12, wherein the maximum-likelihood decoding algorithm queries a subset of the probability distribution associated with an error-sensitive event defined by a given bit string measured from the execution of the quantum circuit.

15. A computer program product for quantum error correction, the computer program product comprising a non-transitory computer readable medium having program instructions embodied therewith, the program instructions executable by a processor to cause the processor to:
execute, using a quantum processor comprising qubits, a quantum error-correcting code on a quantum circuit;
generate a decoding hypergraph by mapping error-sensitive events associated with the executing of the quantum error-correcting code on the quantum circuit to faults of the quantum circuit, wherein the decoding hypergraph comprises:
nodes respectively corresponding to the error sensitive events, and
hyperedges connecting the nodes, and wherein the respective hyperedges correlate the error sensitive events to one or more of the faults that are potential causes of the error sensitive events; and
execute a maximum-likelihood decoding algorithm to determine an error correction for an at least one of the error-sensitive events of the quantum circuit based on the decoding hypergraph.

16. The computer program product of claim 15, wherein the program instructions further cause the processor to:
determine the error-sensitive events by performing a Gottesman-Knill simulation of the quantum circuit.

17. The computer program product of claim 15, wherein the error correction comprises a correction to a logic qubit of the quantum error-correcting code given a measured occurrence of an error-sensitive event.

18. The computer program product of claim 15, wherein the program instructions further cause the processor to:
assign probability values to the hyperedges and generate a probability distribution analyzed by the maximum-likelihood decoding algorithm.

19. The computer program product of claim 18, wherein the maximum-likelihood decoding algorithm queries an entirety of the probability distribution to determine the error correction for one or more executions of the quantum circuit.

20. The computer program product of claim 19, wherein the maximum-likelihood decoding algorithm queries a subset of the probability distribution associated with an error-sensitive event defined by a given bit string measured from the execution of the quantum circuit.

\* \* \* \* \*